United States Patent [19]

Butler

[11] 4,332,986

[45] Jun. 1, 1982

[54] SPEAKER SYSTEM EMPLOYING PASSIVE RADIATOR

[75] Inventor: John L. Butler, Marshfield, Mass.

[73] Assignee: Image Acoustics, Inc., North Marshfield, Mass.

[21] Appl. No.: 117,376

[22] Filed: Jan. 31, 1980

[51] Int. Cl.[3] .......................... H04R 1/28; H05K 5/00

[52] U.S. Cl. ................................ 179/146 E; 181/144; 181/199

[58] Field of Search ............... 179/146 E, 1 E, 1 GA; 181/199, 156, 155, 148, 144

[56] References Cited

U.S. PATENT DOCUMENTS

| | | | |
|---|---|---|---|
| 1,932,343 | 10/1933 | Holland | 181/144 |
| 2,610,694 | 9/1952 | Boer | 179/1 GA |
| 3,815,707 | 6/1974 | Burhoe | 181/199 |
| 3,933,219 | 1/1976 | Butler | 181/144 |
| 4,146,111 | 3/1979 | Mae et al. | 181/154 |
| 4,169,516 | 10/1979 | Honda | 181/153 |

OTHER PUBLICATIONS

"New Ideas in Stereo Speaker Systems", by George L. Augspurger, *Radio-Electronics*, Mar. 1959, pp. 64-67.

*Primary Examiner*—Thomas W. Brown

*Attorney, Agent, or Firm*—Wolf, Greenfield & Sacks

[57] ABSTRACT

A passive radiator, which may be a cone-type radiator is employed in a speaker system enclosure facing downwardly in the direction of the floor upon which the enclosure rests. The bottom wall supporting the passive radiator is preferably spaced a relatively short height above the floor by means of a plurality of legs such as four legs defining four output ports through which sound passes below the basic enclosure. The low frequency sound communicated through the four ports may be used to tune the resonator of the speaker system. With the use of the passive radiator maximum loading is obtained and interference effects are minimized. Also, upper base and mid-range internal reflections are prevented from being re-radiated. Because of the maximizing of loading a smaller passive radiator may be employed. Moreover, the concept of the passive radiator of this invention may be employed both in a single channel speaker system and a dual channel speaker system.

6 Claims, 7 Drawing Figures

SPEAKER SYSTEM EMPLOYING PASSIVE RADIATOR

BACKGROUND OF THE INVENTION

The present invention relates in general to a speaker system, and more particularly, to a speaker system employing a passive radiator for enhancing the low frequency response of the system.

The passive radiator has been employed in the art to extend the low frequency response of the low frequency drivers (woofers) of speaker systems. Originally, these devices were known as drone cone radiators. The passive radiator is many times constructed in the same way as a conventional speaker except for the omission of the magnet and voice coil. The mass of the cone, the radiation inertia, and the stiffness of the suspension system form a resonant system which interacts with the active driver by coupling through the enclosed air of the speaker cabinet or enclosure and also the air directly in front of the speakers. The system employing a passive radiator is designed in a way approximately the same as is used in base reflex or Helmholtz resonator speaker systems. In such systems it is typical for the passive radiator to be mounted on the front panel of the speaker enclosure in the same plane, next to but below the low frequency driver (woofer). The placement of the woofer above the passive radiator essentially elevates the woofer to an undesirable position as far as uniform loading is concerned. Also, this particular forward facing position of the passive radiator allows for re-radiation of internal reflections.

In the past, some conventional acoustic suspension systems, designed without a passive radiator, have had the woofer or woofers disposed in the lowermost position of the speaker enclosure for improved loading. In at least one case the woofer has been positioned at the bottom of the cabinet facing downward. In some systems a stand is provided to raise the enclosure a distance above the floor to enhance the sound communication. Such systems have proven to be unsatisfactory at least in some regard. When the woofer is disposed in its lowermost position close to the floor, the upper base or mid-range information is not readily radiated, whereas, on the other hand, with the woofer raised considerably above the floor, there tends to be sound interference effects generated.

Accordingly, it is an object of the present invention to provide an improved speaker system employing a passive radiator which enhances the communication of low frequency sounds but without the attendant problems outlined hereinabove.

Another object of the present invention is to provide an improved speaker system employing a passive radiator causing an attenuation of the radiation of upper base and mid-range internal reflections.

Still another object of the present invention is to provide an improved speaker system employing a passive radiator that may be of smaller size than in conventional systems.

A further object of the present invention is to provide an improved speaker system employing a passive radiator and which is also characterized by uniform loading.

SUMMARY OF THE INVENTION

In accordance with the invention a technique of bottom loading is provided in which the passive radiator cone is directed and faces toward the floor. This has been found to be desirable since the maximum radiation loading is obtained at low frequencies. Since the passive radiator is basically a low frequency radiator and should not radiate upper base sounds, its position as a bottom loaded device is beneficial. There is defined herein a system which derives the benefits of bottom loading as well as the benefits of a passive radiator system not having the above-mentioned drawbacks. In a system of the invention at least one tweeter is placed in the same plane as and above at least one woofer with the woofer preferably being placed close to the floor for best loading. In accordance with the invention a passive radiator is used preferably disposed in a plane orthogonal to the plane of the woofer and tweeter directed toward the floor. The sound from the passive radiator is communicated to the listener through the area under the basic speaker enclosure usually between ports defined by the legs supporting the enclosure. The height of the under-enclosure space is made sufficiently small in comparison to the passive radiator sound wavelength so that its total radiation resistance is approximately equal to twice its self-radiation resistance. In accordance with another system disclosed herein, which may employ the principles of my U.S. Pat. No. 3,933,219, there are provided two tweeters and two woofers so that stereophonic sound can be obtained. In this case a single passive radiator may be used for both channels simultaneously. At the lower frequencies generally both channels are in phase so that both woofers move in unison and couple to the passive radiator. The bottom facing position of the radiator is preferred in this arrangement not only because of the floor loading, but also because the radiator may be disposed symmetrically quite easily to the two woofers.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

Figure 1:
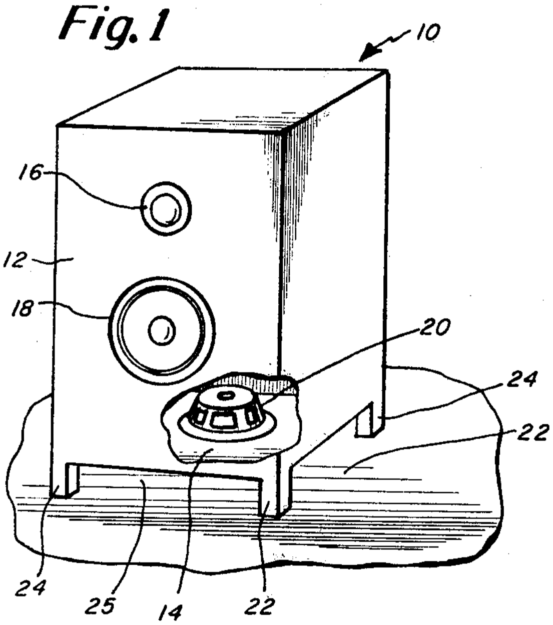
FIG. 1 is a perspective view of one speaker system constructed in accordance with the invention.
Figure 1A:
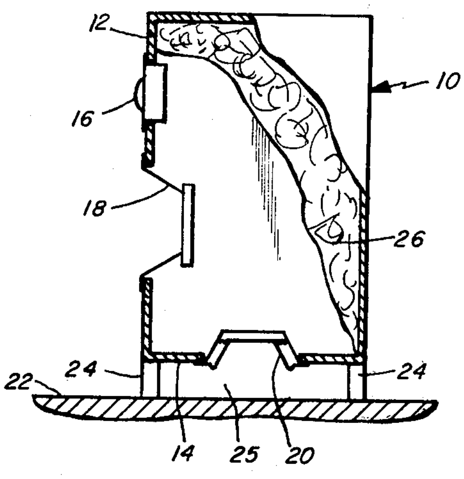
FIG. 1A is a cross-sectional view taken along line 1A—1A of FIG. 1 and depicting the position of the passive radiator.
Figure 2:
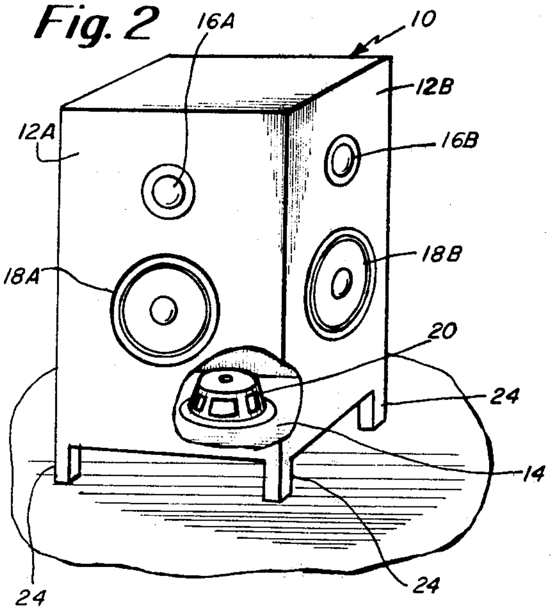
FIG. 2 is a perspective view similar to the one shown in FIG. 1 for a dual channel speaker system with a single shared bottom loaded passive radiator.

FIG. 1 shows a single channel speaker system employing a bottom loaded passive radiator. FIG. 2 shows a dual channel system using a common single passive radiator associated with both channels. In FIGS. 1 and 1A there is shown the single channel speaker system comprising a speaker enclosure or cabinet 10 defined by a plurality of upright walls including front wall 12 and a bottom wall 14. Mounted in the front wall 12, in a conventional manner are two main speakers including the tweeter 16 and the woofer 18. It is noted that the tweeter is disposed directly above the woofer. The woofer is preferably disposed close to the bottom of the front wall for best loading and the passive radiator 20 is disposed in the bottom wall 14 directed substantially orthogonally in its direction to the woofer 18 and relatively close to the floor 22.

In the speaker enclosure shown in FIG. 1A, the enclosure is square, although it need not be limited to a square arrangement, and is supported by four legs 24 which define between adjacent sets thereof four sound ports 25. The height of each sound port is defined by the height of the legs in the embodiment disclosed. The sound from the passive radiator is communicated to the listener through the area under the enclosure and out between the legs through a total area equal to 4HW. For simplicity of discussion a square cabinet has been illustrated. Each individual port 25 has an area HW. FIG. 1A also shows the fiberglass 26 which may be used to at least partially fill the enclosure cavity.

FIG. 2 shows the dual channel speaker system. In this system there are provided adjacent walls 12A and 12B carrying respective tweeters 16A, 16B and woofers 18A, 18B. The enclosure 10 shown in FIG. 2 may be of substantially the same general construction and size as the enclosure shown in FIG. 1 including the bottom wall 14 for mounting the radiator 20 and four legs 24. These legs 24 define therebetween four ports 25. In this embodiment the two tweeters and two woofers are employed so that stereophonic sound can be obtained from one speaker enclosure as previously taught in my U.S. Pat. No. 3,933,219. In the embodiment described in FIG. 2 a single passive radiator 20 is used in common for both channels simultaneously. At the lower frequencies both channels are generally in phase so that both woofers move in unison and couple to the passive radiator 20. The bottom position of the passive radiator 20, in addition to being preferred because of the floor loading, is also the closest symmetrical position in relationship to the two woofers. A cross-section through the embodiment of FIG. 2 would have an appearance very similar to the cross-section of FIG. 1A.

Figure 3A:
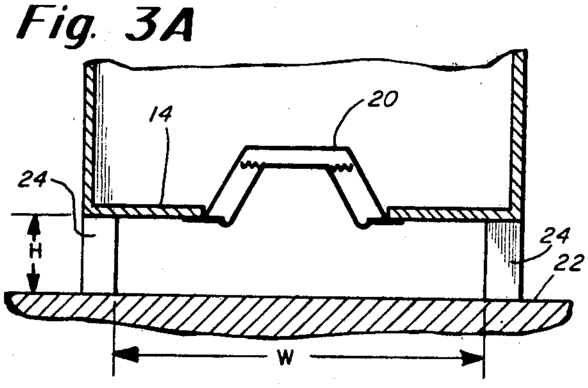
FIGS. 3A and 3B are schematic illustrations of the principle of the present invention employing the passive radiator in a bottom directed location.
Figure 3B:
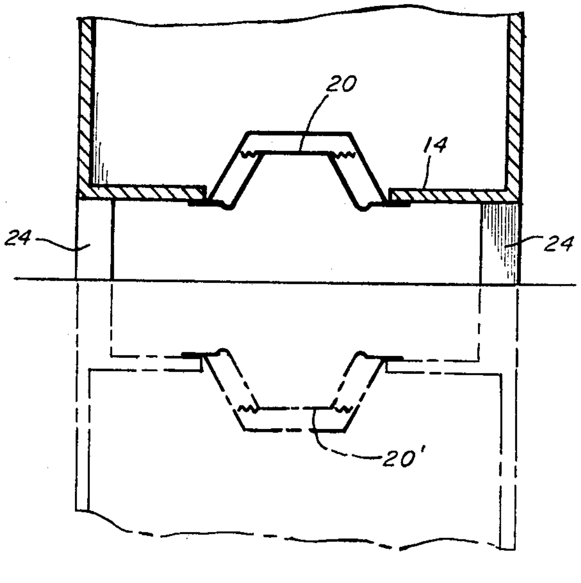

The bottom location for the passive radiator has certain unique properties which provide an efficient low frequency, extended-range, system. The improved operation may be understood most easily by considering the method of images where the floor acts as a rigid reflector and an image of the passive radiator 20' is formed on the opposite side as shown in particular in FIG. 3B. As the passive radiator emits sound, reflections occur off the floor as though there were a second passive radiator (FIG. 3B) an equal distance below the floor. Because the distance H (see FIG. 3A) is a relatively short distance, the source and image signals couple strongly and produce twice as much power output for the same passive radiator motion. This is particular useful since now, only half as much area need be used for the passive radiator cone. In a conventional arrangement employing a passive radiator, the radiator area is usually made twice as great as the driver area to reduce its motion and consequently reduce its distortion. However, with the arrangement of this invention it can be seen that one can employ a passive radiator with an area about the same as that of the woofer and obtain equally good results.

The passage of sound from the passive radiator to the listener is affected by the dimensions H and W. If the total radiation area, 4HW, in the example given, is set equal to the area of the passive radiator, the flow velocity via the ports 25 is the same as that of the passive radiator motion.

If, for a given width W of the port 25, the height H is made smaller, the air motion at the opening of port 25 is greater than that of the passive radiator. Conversely, if the height H is made larger, interference effects come into play, and there is less mutual coupling to the image. Therefore, design is optimized when the total radiation area 4HW, in the example given, is approximately the same as the total effective area of the passive radiator. Similarly, the area adjustment at the port can be made by maintaining the height constant and varying the width W.

However, it should also be noted that changing the length of the dimension W by increasing this dimension, increases the path length from the cone to the exit port 25. This adjustment affects the contained mass and so may be used to lower the resonance of the overall system.

Figure 4:
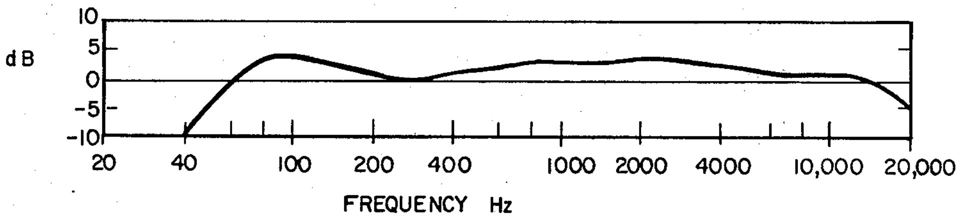
FIG. 4 is a diagram of frequency response of a dual channel system employing a bottom loaded passive radiator.

In a specific embodiment of the system shown in FIG. 2, two 5" woofers may be employed in combination with two 1" dome tweeters in a dual element array on adjacent walls of the cabinet as depicted. The system has a frequency response of 50–20,000 Hertz with a cross-over at 2.5 KHz. The total height of the cabinet excluding the legs is 20" and the width and depth are each 12". The bottom loaded passive radiator is an 8" cone, and each of the legs 24 has a height of 1" with a width and depth of each leg of ¾". As indicated previously, preferably, the interior of the enclosure is partially filled with fiber glass. The measured frequency response of this particular speaker system is shown in FIG. 4. Larger cabinet enclosures may also be provided, one which employs two 6½" woofers and another which employs two 8" woofers.

Figure 5:
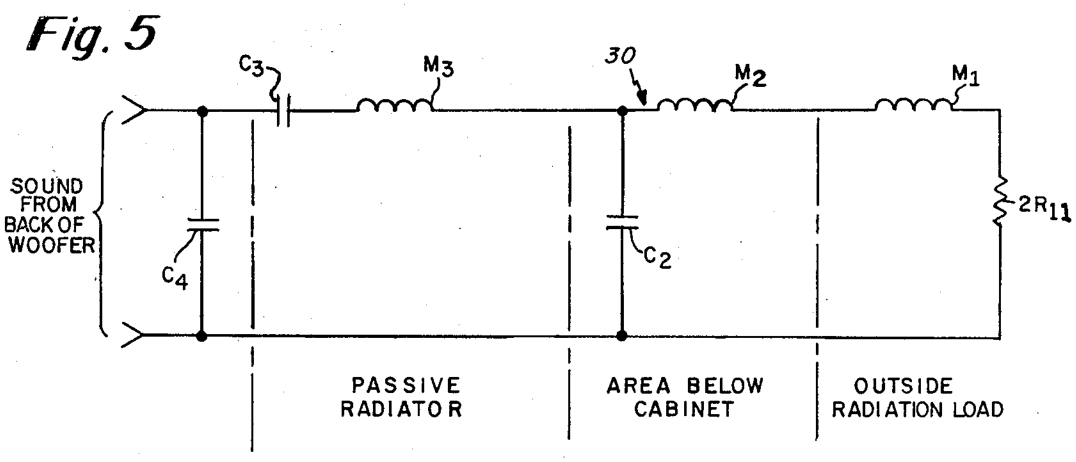
FIG. 5 is an equivalent circuit of the passive radiator and the bottom loading.

The effect of the bottom loading concept of this invention may be analyzed by referring to the equivalent circuit shown in FIG. 5. The equivalent circuit of FIG. 5 includes an input compliance C4, compliance C3 and mass M3 representative of the passive radiator, compliance C2 and mass M2 representative of the area below the enclosure, and radiation mass M1 and radiation resistance $2R_{11}$ representative of the outside radiation load. In a sense it is the center section 30 shown in FIG. 5 representative of the area below the enclosure that is added in accordance with the invention. Without this bottom loading and the inclusion of section 30, the radiation resistance is $R_{11}$ instead of $2R_{11}$ which is the case when the bottom loading is employed. It is seen that the center section 30 acts as a low pass filter with a cut-off frequency $f_c$, above which the system sensitivity rolls off. This prevents the upper base and mid-range radiation of the internal reflections from communicating to the listener. This cut-off frequency is dependent upon the dimensions H and W, and it is preferred that it be set well above the operating range of the passive radiator. It can be seen that this section 30 affords little attenuation below the cut-off frequency but allows the double radiation loading to be in effect.

The double radiation loading is an effect that can be proven through mutual interaction theory, as discussed in my U.S. Pat. No. 3,933,219. With $R_{11}$, the self radiation resistance of a single passive radiator, removed from the floor, the total radiation resistance for this radiator under a bottom loading conditions becomes;

$$R_1 = R_{11}\left(1 + \frac{\sin 4\pi H/\lambda}{4\pi H/\lambda}\right)$$

where; $\lambda$ is the sound wavelength.

When the height of the port H is small compared to the wavelength, then the above equation becomes approximately;

$R_1 = 2R_{11}$.

Thus, with the placement of the passive radiator of this invention, there is provided twice the radiation resistance as desired.

Having described a limited number of embodiments of this invention, it should now be apparent to those skilled in the art that numerous other embodiments are contemplated as falling within the scope of this invention. For example, the storage compartment could also be of a rectangular shape or could even be at least partially curved. In this regard the coupling ports to below the enclosure may be less than 4. For example, a 3-legged enclosure could be provided having 3 corresponding ports. Also, each facing wall may contain more than one woofer or tweeter such as described in my U.S. Pat. No. 3,933,219.

What is claimed is:

1. A speaker system comprising; a speaker enclosure including a plurality of walls including a front wall and a bottom wall, the bottom wall facing the floor upon which the speaker system rests, means supporting the speaker enclosure and the bottom wall above the floor and defining an open space below the bottom wall having at least one port communicating with the bottom space to permit the communication of low-frequency sounds, at least one low-frequency speaker, and a passive radiator means supported at said bottom wall and directly facing the floor to direct signals into said space below said bottom wall, said at least one port defined between legs for supporting the enclosure, wherein the height of the port is small in comparison to the wavelength of sound radiated by the passive radiator means so that the total radiation resistance of the passive radiator means is approximately equal to twice the self-radiation resistance of the passive radiator means.

2. A speaker system as set forth in claim 1 wherein said system is a dual channel system including adjacent walls of the cabinet each supporting respective low-frequency speakers with said passive radiator means operating in common with both said speakers.

3. A speaker system as set forth in claim 2 wherein said passive radiator means is approximately equi-distant from the two speakers.

4. A speaker system as set forth in claim 1 wherein the area of the passive radiator means is approximately equal to the area of the said low-frequency speaker.

5. A speaker system as set forth in claim 1 including separately formed communication ports defined between spacedly disposed legs.

6. A speaker system as set forth in claim 1 wherein the total area of the ports approximately equals the area of the passive radiator means.

* * * * *